United States Patent [19]

Dougherty

[11] Patent Number: 4,741,002
[45] Date of Patent: Apr. 26, 1988

[54] RMS CALCULATION CIRCUIT

[75] Inventor: John J. Dougherty, Avon, Conn.

[73] Assignee: General Electric Company, New York, N.Y.

[21] Appl. No.: 8,449

[22] Filed: Jan. 29, 1987

Related U.S. Application Data

[62] Division of Ser. No. 743,337, Jun. 10, 1985.

[51] Int. Cl.$^4$ .......................... G06F 7/38; G06F 7/552
[52] U.S. Cl. ........................................ 377/49; 377/44; 328/144
[58] Field of Search .................................... 377/44, 49

[56] References Cited

U.S. PATENT DOCUMENTS 3,885,134  5/1975  Bergin et al. .................... 377/44
4,199,719  4/1980  Grob .................................. 377/44

Primary Examiner—John S. Heyman
Attorney, Agent, or Firm—Richard A. Menelly; Walter C. Bernkopf; Fred Jacob

[57] ABSTRACT

The root mean square value of sensed current within a protected circuit is calculated. A frequency multiplying circuit produces a pulse stream having a frequency proportional to the square of the amplitude of an analog signal representation of the circuit current. A root mean square value over a prescribed interval is developed from the squared current value.

7 Claims, 6 Drawing Sheets

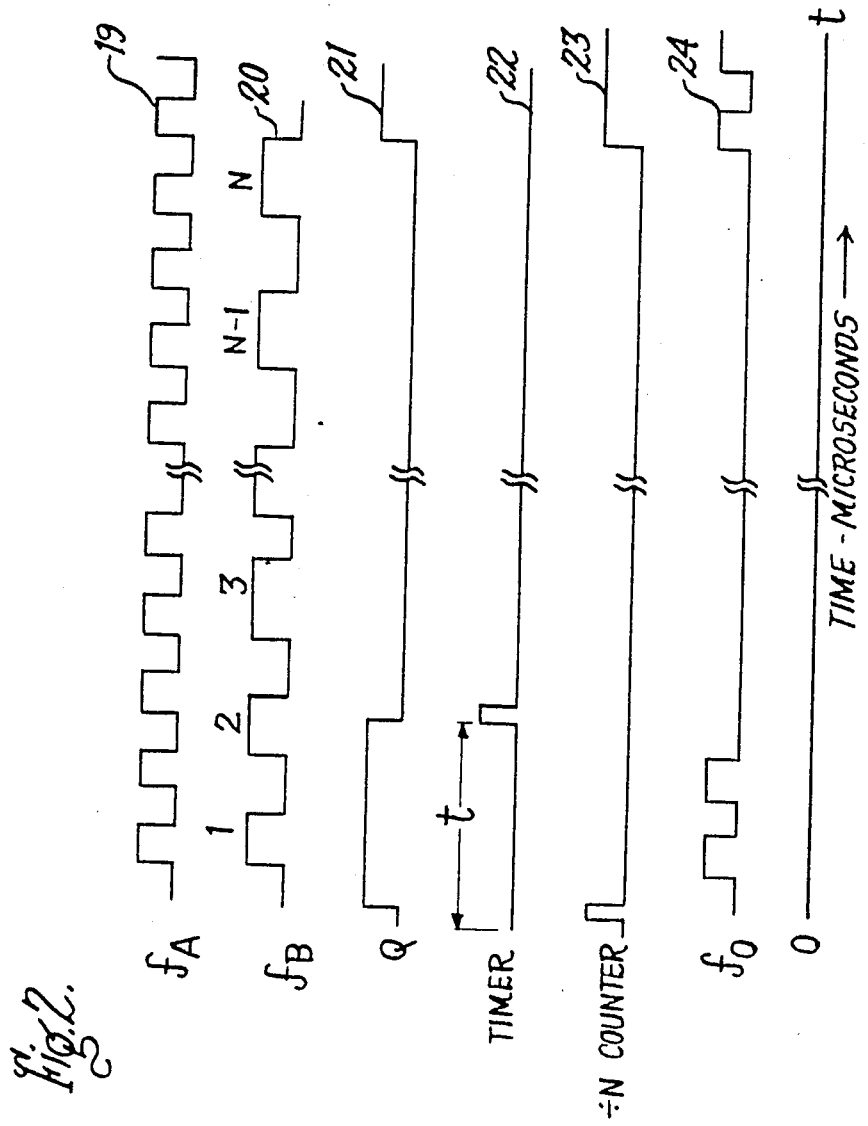

RMS CALCULATION CIRCUIT

This is a division of application Ser. No. 743,337, filed June 10, 1985.

BACKGROUND OF THE INVENTION

A digital circuit interrupter capable of complete implementation by means of very large scale integrated circuit techniques is described within U.S. patent application Ser. No. 631,708 filed July 17, 1984 in the name of John J. Dougherty. The circuit provides digital implementation of overcurrent determination and time delay for interrupting current through a circuit upon comparison with predetermined current values. The circuit employs a peak detecting A/D converter wherein the composite sensed circuit current is compared with the output of a D/A converter and a fixed clock pulse is compared to the output of this comparison. An $I^2t$ digital value controlled by the peak value of the composite current is used as a measure of the current through the protected circuit.

When peak current is sensed within a protected circuit in industrial applications, there have been occurrences of false tripping caused by distorted current waveforms where 5th and 7th harmonic components can add to the peak value causing the peak value to exceed predetermined long time and short time pick-up values resulting in so-called "nuisance tripping" with accompanying loss in productivity. The electrical circuit must be independently tested to insure that no fault current actually exists before the circuit breakers can be reclosed and the industrial equipment can be made operational. This condition is more prevalent in electrical transmission and distribution systems employing power factor correction by the addition of large capacitor banks which tend to distort the sinusoidal waveform components. When highly inductive loads are employed, such as large induction furnaces, the sensed current waveform becomes harmonically distorted such that the 7th harmonic component adds to the peak current value causing an apparent overcurrent condition although the actual RMS current value is well below accepted limits. It has been determined that the current waveform distortion is not a problem when the RMS value of current is sensed, rather than the peak value as is now the custom in most industrial power circuits. RMS detection also provides a more realistic evaluation of the actual heating effect upon the power buses which are protected by the circuit interruption equipment within the protected circuit.

This invention therefore proposes a circuit whereby RMS calculation is made on a continuing basis as a measure of the composite current flowing through the protected circuit.

SUMMARY OF THE INVENTION

RMS current determination is provided by generating a pulse stream representation of current having a frequency proportional to the square of the amplitude of the analog current signal. The squared current value is integrated over a prescribed interval and a root mean square value is determined therefrom.

BRIEF DESCRIPTION OF THE DRAWINGS

FIG. 2 is a graphic representation of the timing diagrams for the frequency pulses generated within the circuit of FIG. 1;

GENERAL DESCRIPTION OF THE INVENTION

Figure 1:
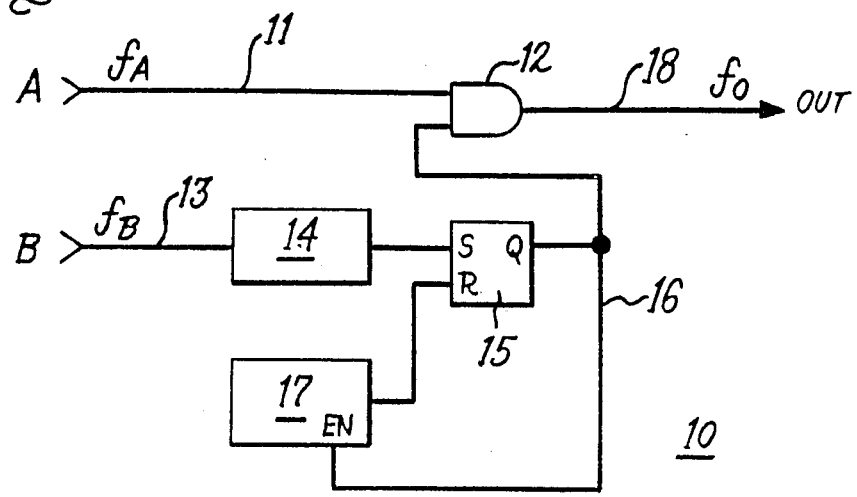
FIG. 1 is a diagrammatic representation of a frequency multiplying circuit according to the invention.

Before describing the RMS determining circuit of the invention it is helpful to define the operation of a frequency multiplying circuit. One such frequency multiplying circuit 10 is depicted in FIG. 1 and consists of an input line 11 connected with a source A of one frequency $f_A$. The source can comprise a voltage to frequency converter (V/F) such as the type that converts the magnitude of a current or voltage analog signal into a frequency which can then be operated on digitally. The analog input signal, for example, could control the bias of a varactor diode used as the frequency determining component of a resonance circuit within an oscillator such that the frequency of oscillation would depend on the value of the input signal. An advantage of the voltage to frequency A/D converter is that it provides a digital representation of the average value of the input during the conversion interval. The $f_A$ frequency input line 11 is connected to one input of an AND gate 12. A separate source of frequency B is connected over an input line 13 to a divide-by-N counter 14 and the output of the counter is connected with the SET input of an RS flip flop 15. The RESET input is connected to a fixed timer 17, the ENABLE input of the timer is connected with the Q output of the flip flop and to the other input of the AND gate 12 over conductor 16. The timer is enabled when the flip flop is "set", that is, when the Q output is in a "high" state. The output line 18 provides a frequency $f_O$ which is a function of the product of $f_A$, $f_B$ as shown by referring now to the timing diagrams depicted in FIG. 2. These diagrams represent a single cycle timing diagram represented on a common timebase axis for each of the terminals depicted in the frequency multiplying circuit 10. Each of the pulses depicted represent the presence (1) or the absence (0) of a voltage signal, that is, a "high" or a "low" state as indicated. The cycle begins as the binary counter 14 ends its count. A high output sets the flip flop and a high Q signal is then applied to one input of the AND gate. With one input high, the output of the AND gate on line 18 will follow the state of the other input and is a function of the frequency $f_A$ over input line 11. When the flip flop is set, two other processes begin. The fixed timer 17 is started and the binary counter 14 starts from its maximum count. After a time increment t, the timer resets the flip flop and no signals appear on the output line 18 from the AND gate. The relationship between the high and low states on the input line for $f_A$ is shown at 19 for comparison to the input represented by the pulses of increasing pulse width from 1 to n for the input line 13 for $f_B$ as shown at 20. The condition of the Q output of the flip flop is depicted at 21 for comparison with the state of the constant timer shown at 22. The time delay t is indicated as the time in which the Q output remains high. The state of the binary counter 14 which is represented as a divide-by-N counter, is shown at 23 and the condition of the output line 18 carrying the output frequency $f_o$ from AND gate 12 is represented at 24.

The mathematical relationship between the number of pulses p representing the frequency $f_o$ on the output line 18 is given by the expression:

$$p = \frac{t}{1/f_a} = f_a t$$

The flip flop remains reset, inhibiting pulses, until the cycle is completed by the binary counter 14. The binary counter starts a new cycle after n pulses are received on the input line 13 carrying frequency $f_B$. The time for the total cycle is given by the expression:

$$T = n \times \frac{1}{f_b} = \frac{n}{f_b}$$

The output frequency $f_o$ has a value over the cycle given by the expression:

$$f_o = P/T$$

Substituting for the above results in the expression:

$$f_o = f_a \frac{t}{n/f_b} = \frac{t}{n} f_a f_b$$

Figure 3:
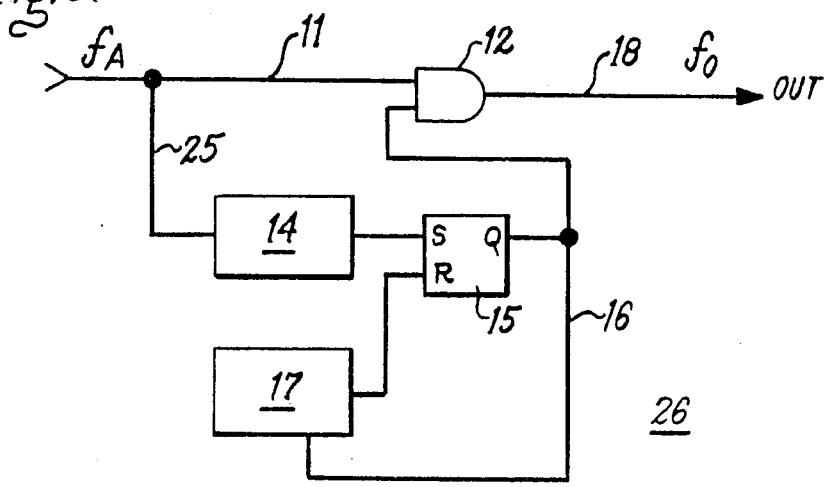
FIG. 3 is a diagrammatic representation of a frequency squaring circuit according to the invention.

FIG. 3 shows a frequency squaring circuit 26 wherein the frequency source B depicted earlier in FIG. 1 is eliminated and the binary counter 14 is coupled with the input line 11 carrying the single frequency $f_A$. Similar elements are identified by common reference numerals and the circuit operates in the manner previously described with the following result.

The time for the total cycle is now given by the expression:

$$T = n/f_a$$

which becomes, by substitution, $$f_o = t/n \times f_a^2.$$

Figure 4:
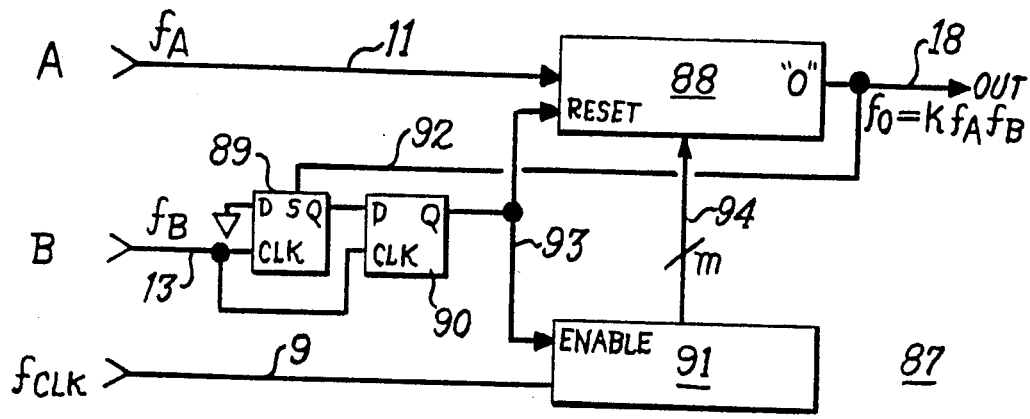
FIG. 4 is a diagrammatic representation of an alternate frequency multiplying circuit according to the invention.

A simplified frequency multiplying circuit 87 is shown in FIG. 4 with the frequency Source A connected with an input to a divide-by-N counter 88 over input line 11 and with the frequency Source B connected in common over input line 13 with the CLK terminals of a DSQ flipflop 89 and a DQ flipflop 90. A clock frequency is provided over input line 9 to the input of an UP-counter 91. The PRESET terminal of the divide-by-N counter and the ENABLE terminal of the UP-counter are interconnected over conductor 93 with the Q output of the DQ flipflop 90. The Q output of the DSQ flipflop 89 is connected with the D input to the DQ flipflop and the S output of the DSQ flipflop is connected with the output line 18 over conductor 92. The m-data bits from UP-counter are supplied to an input to the divide-by-N counter over multiple conductor 94.

When the divide-by-N counter 88 equals "∅" pulses, the UP-counter is enabled for one period of the input frequency $f_A$. During this period the UP-counter accumulates $f_{CLK}/f_B$ pulses where $f_{CLK}$ is larger than the maximum value of either $f_a$ or $f_B$. The time t between "∅" pulses is given by the expression:

$$t = (f_{CLK}/f_B)(1/f_A) = 1/f_{OUT}$$

therefore $f_{OUT} = K f_A f_B$, where $K = 1/f_{CLK}$

Figure 5:
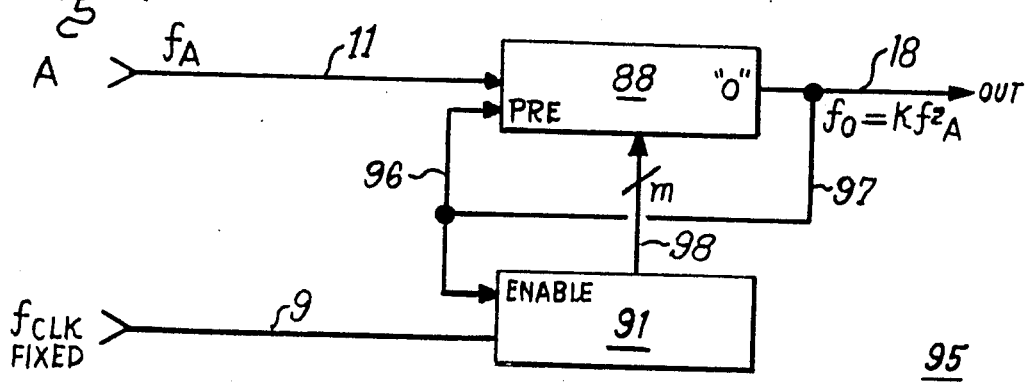
FIG. 5 is a diagrammatic representation of an alternate frequency squaring circuit according to the invention.

A simplified frequency squaring circuit 95 is shown in FIG. 5 where the frequency source A is connected with an input to a divide-by-N counter 88 over input line 11. The fixed clock pulse is connected over input line 9 to one input to the UP-counter 91. The PRESET terminal of the divide-by-N counter is interconnected with the ENABLE input to the UP-counter over line 96 and with the output line 18 over line 97. The m-bit data output from the UP-counter is inputted to the divide-by-N counter over conductor 98.

The frequency squaring circuit 95 operates in a similar manner to the aforementioned frequency multiplying circuit 87 except that the UP-counter now accumulates $f_{CLK}/f_A$ counts during one period of the input frequency $f_A$ when the divide-by-N counter 88 equals "∅" pulses. The divide-by-N counter is preset to the UP-counter value ($f_{CLK}/f_A$) on the trailing edge of the "∅" pulse and the UP-counter is cleared. The time t between "∅" pulses is now given by the expression:

$t(f_{CLK}/f_A)(1/f_A)$ and $f_o = 1$ pulse/$(f_{CLK}/f^2_A)$ seconds which simplifies to:

$f_o = K f_{A2}$ where $K = 1/f_{CLK}$

DESCRIPTION OF THE PREFERRED EMBODIMENT

Figure 6:
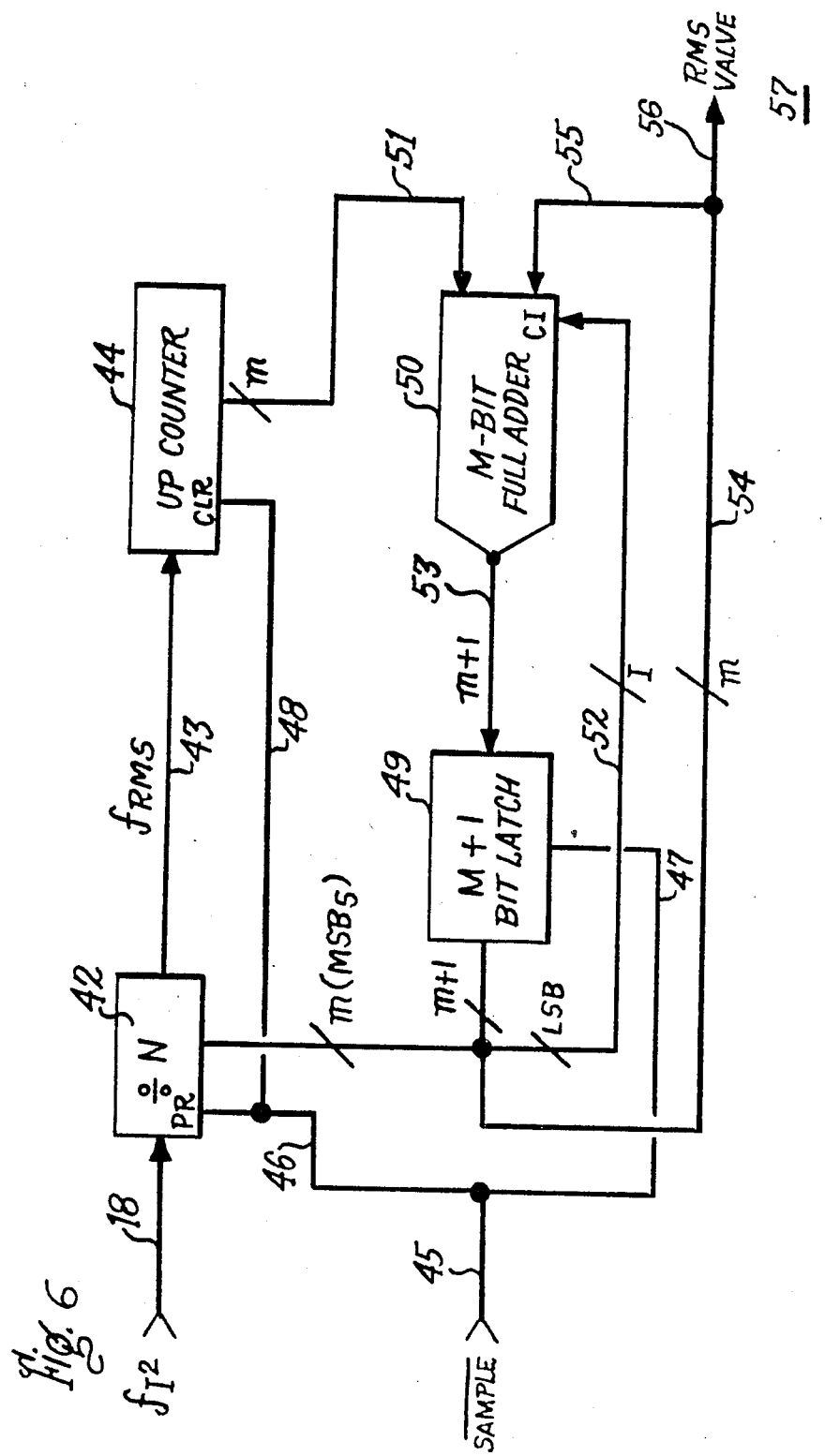
FIG. 6 is a diagrammatic representation of an RMS calculation circuit according to the invention.

The RMS calculation circuit 57 depicted in FIG. 6 can take the frequency value $f_o$, provided by the frequency squaring circuit 26 of FIG. 3, and provide this value as the frequency representation of the square of the circuit current, $f_I^2$, over input line 18 and by the interconnection of a divide-by-N counter 42, an UP counter 44, M+1 bit latch 49 and m-bit full adder 50 produce an m-bit RMS value on multiple output line 56. Before describing the details of the RMS determining circuit it is helpful to describe the mathematic functions performed therein. A known iterative procedure for calculating the square root of any number is given by the expression:

$$Ai + 1 = \frac{Ai}{2} + \frac{X}{2Ai} = \frac{1}{2}\left(Ai + \frac{X}{Ai}\right)$$

wherein i represents the iteration index of the series expression, $A_i$ represents the last estimate of the square root value and X represents the number which equals the square value. The series converges very rapidly on the square root value with a reasonable initial value for A. The root mean square value of an electrical signal over a prescribed time T is given by the expression:

$$RMS = (X^2_{AVG}/T)^{\frac{1}{2}}$$

where $X^2_{AVG}$ equals the average value of the square of the signal X and RMS equals the root mean square value.

Referring again to the RMS circuit 57 of the FIG. 6 the aforementioned mathematical function is performed digitally in the following manner. The input signal proportional in frequency to the square of an input current I, such as with the frequency squaring circuit 26 of FIG. 3, is applied over input line 18 to the input of a divide-by-N counter 42. The dividing factor of this counter is an m-bit digital value which relates to the expression "$A_i$" described earlier. The output of the divide-by-N counter is applied over conductor 43 to a simple binary UP-counter 44. The m-bit output from the UP-counter, which is applied to an m-bit full adder 50 over conductor 51, corresponds to the term $X \div A_i$. The SAMPLE signal is a timing pulse from a clock (not shown) designed to implement the calculation of an RMS signal, the period of which corresponds to the prescribed time T in the earlier expression for the RMS calculation. The SAMPLE timing pulse over input line 45 is connected with the PR terminal of the divide-by-N counter 42 over conductor 46 and with one input to an m+1 bit latch 49 over conductor 47. The SAMPLE timing pulse is connected with the CLR input to the UP-counter 44 over conductor 48. The m+1 data bits from the m-bit full adder 50 are inputted to the m+1 bit latch 49 over conductor 53. The m most significant data bits from the m+1 bit latch are applied to one input of the divide-by-N counter 52 and the least significant data bit is applied to the CARRY-IN input of the m-bit full adder 50 over line 52 and the other input to the m-bit full adder 50 is supplied with the m most significant data bits over conductors 54 and 55. The output line 56 which joins conductors 54, 55 carries the resultant RMS binary value.

In performing the RMS calculation, the RMS circuit operates in the following manner. Upon receipt of the SAMPLE pulse, the UP counter 44 has been cleared and a new value $A_i$ has been set into the divide-by-N counter 42. For a period of time T, the UP counter 44 accumulates pulses at the following rate:

$$fRMS = f_I^2 \div A_i.$$

After the period of time T, the UP counter 44 has accumulated $f_I^2 \times T \div A_I$ counts which is applied to one input of the m-bit full adder 50 over conductor 51. Another input to the m-bit full adder receives the last estimate $A_i$. Upon receipt of the SAMPLE pulse the two inputs to the m-bit full adder and the CARRY-IN bit from the least significant bit of the m+1 bit latch 49 are added and the output is the m-bit+the CARRY-bit, (m+1), which is represented by the expression $$A_i + f_I^2 \times T \div A_i.$$

A new estimate of the RMS value can be obtained by dividing this expression by two. In binary notation this is achieved by shifting the dividend $A_{i+1}$ by one bit. This is performed within the RMS circuit of the invention by using the CARRY bit of the m+1 adder as the most significant bit (MSB) of the new estimate and using the m−1 most significant outputs of the m-bit full adder stages. The trailing edge of the SAMPLE pulse is used to latch the new RMS estimate, clear the UP counter 44 and preset the divide-by-N counter 42.

Figure 7:
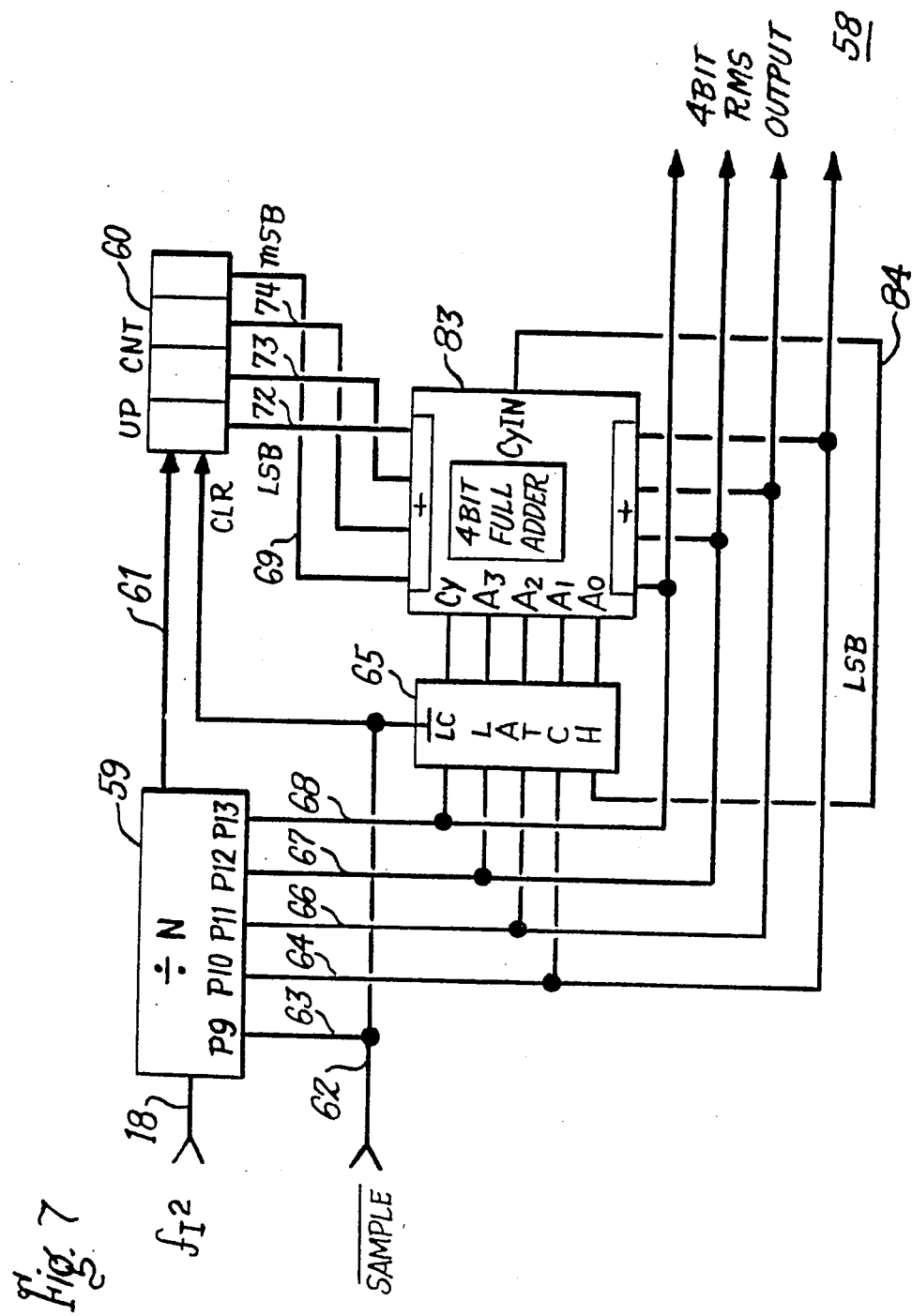
FIG. 7 is a diagrammatic representation of a 4-bit RMS calculation circuit according to the invention.

A 4-bit RMS calculation circuit 58 is shown in FIG. 7 where the divide-by-N counter 42, the UP counter 44, m+1 bit latch 49 and m-bit full adder 50 RMS circuit 57 of FIG. 6 are replaced respectively by the divide-by-N counter 59, 4-bit UP counter 60, 4-bit latch 65 and 4-bit full adder 83. The frequency representative of the current squared ($f_i^2$) is connected with the divide-by-N counter 59 by means of input line 18 and the output of the divide-by-N counter is connected to one input of the UP counter 60 by means of conductor 61. The SAMPLE pulses are connected to the pin 9 terminal of the divide-by-N counter over conductor 63, to the LATCH terminal of latch 65 and to the CLEAR terminal of the UP/DOWN counter 60 over conductor 62. The latch output terminals are connected to the divide-by-N pin 10, pin 11, pin 12, and pin 13 terminals over conductors 66, 67 and 68 respectively. The latch input terminals are connected to the CARRY and $A_0$–$A_3$ OUTPUT terminals of the 4-bit full adder 83 as indicated. The CARRY-IN input of the 4-bit full adder is connected with an output of the latch 65 for generating the least significant data bit (LSB) to the 4-bit full adder over conductor 84. The most significant data bit (MSB) is provided from the UP counter 60 to the 4-bit full adder 83 over conductor 69 and the least significant data bit (LSB) is provided to the 4-bit full adder over conductor 72. The remaining input terminals of the 4-bit full adder are interconnected with the counter output terminals by means of conductors 73 and 74. The conductors 66, 67 and 68 which interconnect the latch 65 and the 4-bit full adder comprise the 4-bit RMS output. The least significant bit (LSB) of the output of the 4-bit full adder 83 is used in calculating the next result by looping into the CARRY-IN input which comprises the least significant adder stage to effect a "rounding up" of the discarded data bit. For practical purposes, the UP counter 60 must be prevented from "rolling over", that is, exceeding the maximum count and returning to zero. Some circuitry is required to either hold the counter at a maximum count or set all of the 4-bit full adder inputs at a maximum. The selection of the number of bits of resolution is linked to the maximum input signal of interest and the period P for which the RMS value is desired. At steady state conditions the following mathematical expressions apply:

$$A_{i+1} = (f_I^2 \times T \div A_i + A_i) \div 2$$

For the m-bit full adder 50 of FIG. 9 saturation occurs at $f_I^2$max as seen from the following expression:

$$A_I = 2^m - 1 = f_I^2{}_{max} \times T \div (2^m - 1.)$$

This simplifies to:

$$(2^m - 1)^2 = f_I^2{}_{max} \times T.$$

The actual resolution for the 4-bit RMS circuit 58 depicted in FIG. 9 is $2^m - 1$ where m=4. If the RMS value is desired over a single 60 Hz cycle where the period T is 16.6 ms, the frequency squaring circuit 26 depicted in FIG. 3 at full scale analog input, should be designed for a pulse rate given by the following expression:

$$f_I^2{}_{max} = (2^m - 1)^2 \div T = 15^2 \div 0.1666 = 13500 \text{ Hz.}$$

Since the RMS circuit does not alter the input signal, several circuits of varying periods can be paralleled to measure RMS values over different time intervals for obtaining even higher resolutions.

Figure 8:
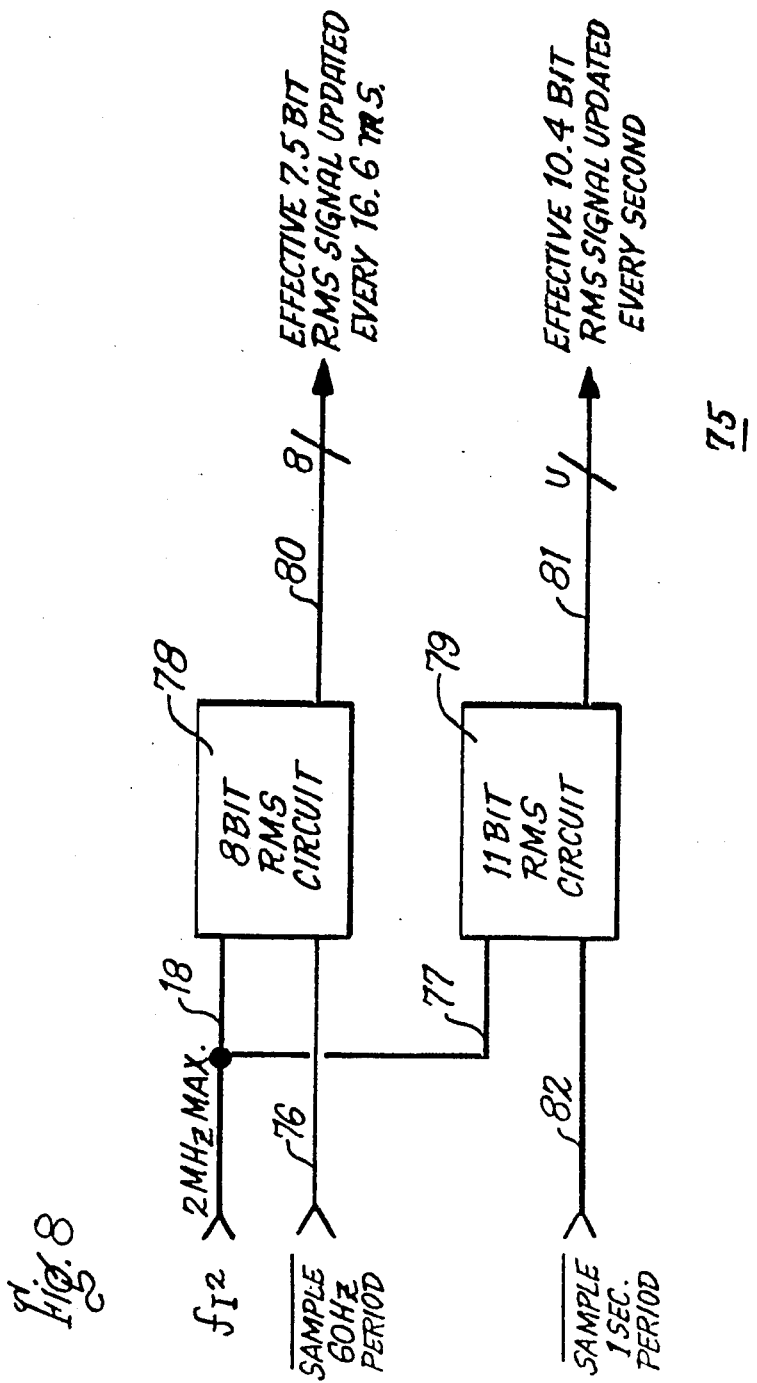
FIG. 8 is a diagrammatic representation of a multiple RMS calculation circuit according to the invention.

FIG. 8 depicts a multiple RMS calculation circuit 75 wherein an 8-bit RMS circuit 78 is connected in parallel with an 11-bit RMS circuit 79. A frequency $f_I^2$ proportional to the circuit current squared is inputted to the 8-bit RMS circuit 78 over line 18 and to the 11-bit RMS circuit 79 over line 77. A SAMPLE pulse having a frequency of 60 Hz is inputted to the 8-bit RMS circuit over conductor 76 and an additional SAMPLE pulse having a period T of one second is inputted to the 11-bit RMS circuit over conductor 82. An effective 7.5-bit RMS signal appears over conductor 80 and is updated every 16.6 milliseconds while an effective 10.4-bit RMS signal appears over conductor 81 and is updated every second. The mathematical expression for this combined circuit is given for a maximum square frequency $f_I^2$ of 2 mHz over a 16.6 millisecond time interval i.e., 60 Hz cycle with the following results:

$$(2^m - 1)^2 \cong 2^{2m} = f^2_{max}T$$

solving for m results in the following expression:

$$m = \frac{1}{2} \frac{\ln(f^2 \max T)}{\ln 2} = \frac{\ln(2 \times 10^6/60)}{2(.693)}$$

The value for m is equal to 7.5 for the example given and results in a resolution of 0.5%. Although this resolution is suitable for control purposes, a one second interval for T is more acceptable for purposes of measurement, and the m value for the one second time interval results in the following expression:

$m = 1/2 \ln(2 \times 10^6) \div 0.693 = 10.4$ with a resolution of 0.07%.

It has thus been shown that the application of a frequency multiplying circuit results in RMS representation of analog voltage and current values.

Having described my invention, what I claim as new and desire to secure by Letters Patent is:

1. An RMS determining circuit comprising:
   a divide-by-N counter having one input connected with a frequency multiplier for receiving a first frequency proportional to a multiple of current flowing through a power circuit and having another input connected with a sample frequency source for receiving a predetermined second frequency and generating an output frequency less than said first frequency;
   an UP-counter having a first input connected with said divide-by-N counter for receiving said output frequency and having a clear input for receiving said predetermined second frequency, said UP-counter providing an m-bit representation of said first frequency at an output; and
   an m+1 bit latch having one input connected with said sample frequency source and another input connected within an m-bit adder, an output on said m+1 bit latch being connected with said divide-by-N counter a first input on said m-bit adder and a CARRY-IN input on said m-bit ADDER for providing an RMS representation of said circuit current, a second input to said m-bit ADDER being connected with said UP counter.

2. The RMS determining circuit of claim 1 wherein said output frequency equals said first frequency divided by the m-bit binary value from the most significant bits of from said m+1 bit latch.

3. The RMS determining circuit of claim 1 wherein said m+1 bit latch provides an "m" data bit to said divide-by-N counter, said m data bit being representative of a most significant data bit, and a "1" data bit to said m-bit ADDER said "1" data bit being representative of a least significant data bit.

4. The RMS determining circuit of claim 1 wherein said m-bit ADDER provides an m+1 data bit to said m+1 bit latch.

5. The RMS determining circuit of claim 1 wherein said m+1 latch provides m data bits at said RMS output said m data bits being equivalent to the RMS value of said circuit current.

6. The RMS determining circuit of claim 1 including:
   a second divide-by-N counter, a second UP-counter, a second m+1 bit latch and a second m-bit adder electrically connected in parallel respectively with said divide-by-N counter, said UP-counter, said m+1 bit latch and said m-bit full adder, said second divide-by-N counter also being connected with a third predetermined frequency for providing a second data-bit at a second RMS output equivalent to the RMS value of said circuit current.

7. The RMS determining circuit of claim 6 wherein said full m-bit full adder comprises an 8-bit full adder and said second m-bit adder comprises an 11-bit full adder, said first data bit comprising an 8 data bit at said RMS output and said second data bit comprising an 11 data bit at said second RMS output.

* * * * *